United States Patent
Rasing et al.

(10) Patent No.: US 9,627,023 B2
(45) Date of Patent: Apr. 18, 2017

(54) MAGNETO-OPTICAL DEVICE

(71) Applicant: Stichting Katholieke Universitiet Nijmegen, Nijmegen (NL)

(72) Inventors: Theodorus Henricus Maricus Maria Rasing, Nijmegen (NL); Matteo Savoini, Nijmegen (NL)

(73) Assignee: Stichting Katholieke Universiteit Nijmegen, Nijmegen (NL)

( * ) Notice: Subject to any disclaimer, the term of this patent is extended or adjusted under 35 U.S.C. 154(b) by 0 days.

(21) Appl. No.: 15/154,598

(22) Filed: May 13, 2016

(65) Prior Publication Data

US 2016/0322089 A1    Nov. 3, 2016

Related U.S. Application Data

(63) Continuation of application No. PCT/NL2014/050787, filed on Nov. 14, 2014.

(30) Foreign Application Priority Data

Nov. 14, 2013 (NL) ..................................... 2011800

(51) Int. Cl.
*G11B 5/66* (2006.01)
*G11C 11/02* (2006.01)
*G11C 11/16* (2006.01)
*G11C 13/04* (2006.01)
*G11C 13/06* (2006.01)

(52) U.S. Cl.
CPC .............. *G11C 11/02* (2013.01); *G11C 11/16* (2013.01); *G11C 13/04* (2013.01); *G11C 13/06* (2013.01)

(58) Field of Classification Search
CPC ....................................................... G11C 13/06
USPC ........................................................ 428/818
See application file for complete search history.

(56) References Cited

U.S. PATENT DOCUMENTS

| 5,835,435 A | 11/1998 | Bogin et al. |
| 2001/0000483 A1* | 4/2001 | Tamanoi ........... G11B 11/10515 428/821 |

FOREIGN PATENT DOCUMENTS

| WO | 2013/131510 | 9/2013 |
| WO | 2015/072856 | 5/2015 |

OTHER PUBLICATIONS

He, et al., "Ultrafast demagnetization enhancement in CoFeB/MgO/CoFeB magnetic tunneling junction driven by spin tunneling current", Scientific Reports, vol. 3, No. 2883, 2013, 1-5.
Krupa, "Changes in the Structure and Magnetic Characteristic of Nanofilms and Control of Spin Current by Short Laser Pulses", American Journal of Nanomaterials, vol. 1, No. 2, 2013, 13-23.
Miao, et al., "Tunneling path toward spintronics", Reports on Progress in Physics, vol. 74, No. 3, 036501, 2011, 1-19.

* cited by examiner

*Primary Examiner* — Hoai V Ho
(74) *Attorney, Agent, or Firm* — Peacock Myers, P.C.; Jeffrey Myers

(57) ABSTRACT

A magneto-optical device comprising a magnetic unit and an optical unit, an electronic device comprising the magneto-optical device, a method of energy saving using the magneto-optical device, an array comprising the magneto-optical devices, and a method of changing magnetic orientation.

14 Claims, 2 Drawing Sheets

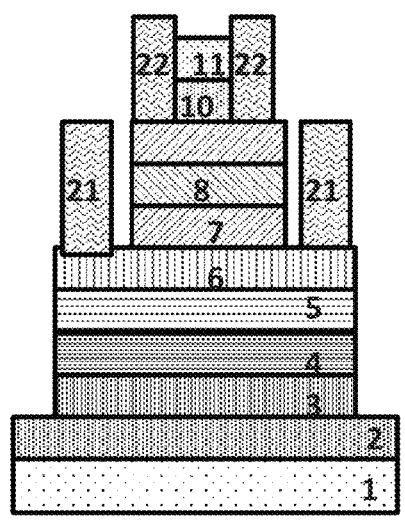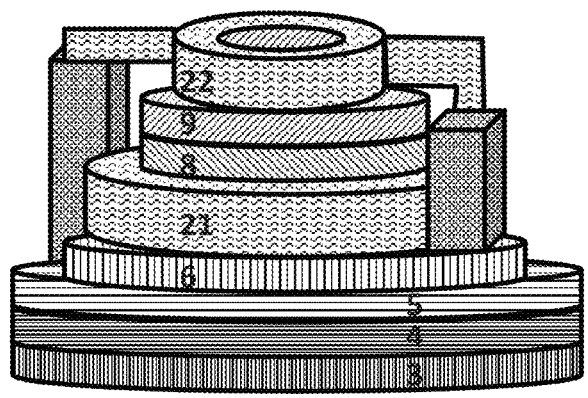
Fig. 1a
Fig. 1b
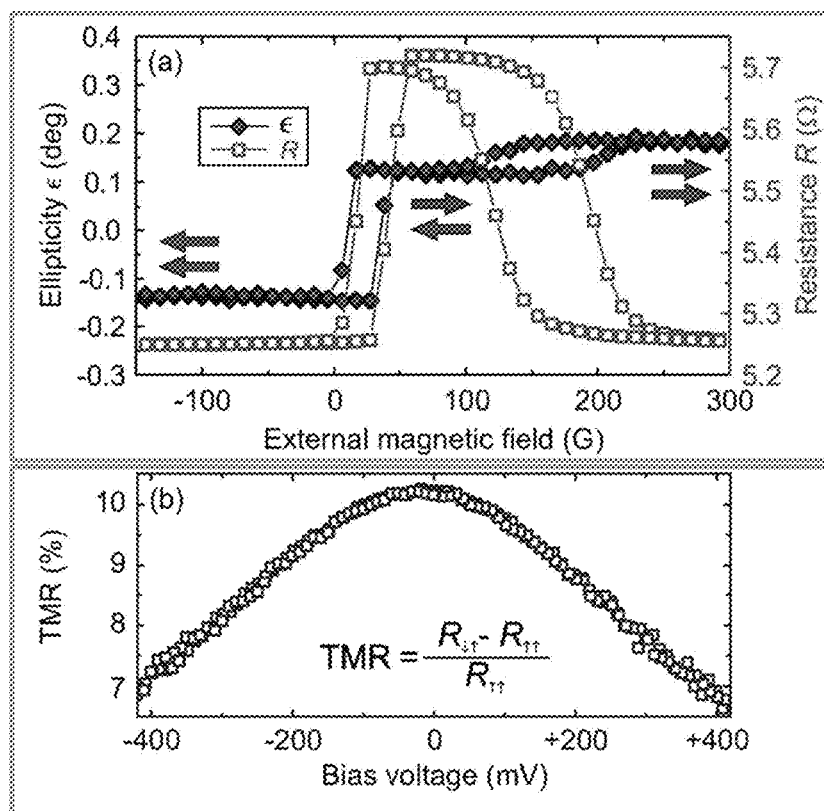
Fig. 2a
Fig. 2b

US 9,627,023 B2

MAGNETO-OPTICAL DEVICE

CROSS REFERENCE TO RELATED APPLICATIONS

This Application is a continuation application of the International Patent Application with Serial No. PCT/NL2014/050787, entitled "Magneto-optical Device", filed on Nov. 14, 2014, which claims the priority of NL2011800, filed on Nov. 14, 2013, and the specification and claims thereof are incorporated herein by reference.

STATEMENT REGARDING FEDERALLY SPONSORED RESEARCH OR DEVELOPMENT

Not Applicable.

INCORPORATION BY REFERENCE OF MATERIAL SUBMITTED ON A COMPACT DISC

Not Applicable.

COPYRIGHTED MATERIAL

Not Applicable.

DESCRIPTION OF RELATED ART

Field of the Invention

The present invention is in the field of a magneto-optical device comprising a magnetic unit and an optical unit, an electronic device comprising the magneto-optical device, a method of energy saving using the magneto-optical device, an array comprising the magneto-optical devices, and a method of changing magnetic orientation.

Background of the Invention

In IC-technology most CMOS devices, such as microprocessors, are based on Von Neumann architecture in which logic and memories are separate components. Even further it is often difficult to integrate logic and memory parts, due to process limitations and different nature of the two. Logic and likewise processors comprise (analogue) basic type transistors, whereas memory parts may comprise more complex transistors, or magnetic memory.

A transistor is a device used to amplify and switch electronic signals and electrical power, typically a semiconductor device. It is composed of semiconductor material with at least three terminals for connection to an external circuit. A characteristic of the transistor is that if a voltage or current is applied to one pair of the transistor's terminals it changes the current through another pair of terminals. Because by application of the voltage or current a controlled (output) power can be higher than a controlling (input) power, a transistor can amplify a signal. Nowadays transistors may still be packaged individually, but a multitude thereof is found embedded in integrated circuits (ICs).

Therefore the transistor may be considered as a (or the) fundamental building block of modern electronic devices, specifically semiconductor devices, such as chips, and is ubiquitous in modern electronic systems. It is used in electronic equipment, such as radios, calculators, mobile phones, near field communication (NFC) devices, and computers.

By applying a small signal to a transistor between one pair of its terminals a much larger signal at another pair of terminals is controlled. This property is called gain, that is, it can act as an amplifier. Alternatively, the transistor can be used to turn current on or off in a circuit as an electrically controlled switch, where the amount of current is determined by other circuit elements being in electrical connection with the transistor.

There are two basic types of transistors having a different use. In a first a current controls a current, in a second a voltage controls a current. In the first, a bipolar transistor has terminals typically labelled base, collector, and emitter. A small current at the base terminal (that is, flowing between the base and the emitter) can control or switch a much larger current between the collector and emitter terminals. In the second, in a field-effect transistor, the terminals are labelled gate, source, and drain, and a voltage at the gate can control a current between source and drain.

In a typical bipolar transistor in a circuit charge will flow between emitter and collector terminals depending on the current in the base. Because internally the base and emitter connections behave like a semiconductor diode, a voltage drop develops between base and emitter while the base current exists. The amount of this voltage depends on the material the transistor is made from, and is referred to as $V_{BE}$. For a field effect transistor a similar mechanism occurs.

A magneto-resistive random-access memory (MRAM) is a non-volatile random-access memory. Over the years a continued increase in density has been achieved, mainly due to improved lithographic processes.

The MRAM is an example of so-called spin-electronics, which is considered a very rapidly expanding area of technology which merges magnetism and electronics. Several breakthroughs have further boosted this field, such as giant magnetoresistance, spin-valves, tunnel magnetoresistance, spin transfer, and voltage controlled magnetic properties. Spin-electronics has found applications in hard disk drives and more recently in non-volatile standalone memories, such as MRAM.

In conventional RAM chip technology, data is stored as electric charge or current flows. In MRAM data is stored on magnetic storage elements. Typical prior art elements are formed from two ferromagnetic layers. Each can hold a magnetization. The plates are separated by a thin insulating layer. One of the two layers has a permanent magnetization with a fixed direction and magnitude. The magnetization of the second layer may be parallel to that of the first magnetization, or (partly) opposite thereto. The second layer may be considered as a storage area of memory, being in a parallel or opposite mode. This configuration is also referred to as a spin valve and is considered as the simplest structure for an MRAM single unit, also called a bit. A memory device is built from a grid of such elements, also referred to as "cells".

A simple method of reading (a memory cell) is by measuring an electrical resistance of the cell. Thereto a transistor may be provided, the transistor being in connection with the cell. A particular cell is selected by powering the associated transistor. The transistor switches a current from a supply line through the cell to ground. Thereby a magnetic tunnel effect is exploited. Due to the magnetic tunnel effect, the electrical resistance of the cell changes due to the relative orientation of the magnetizations in the two plates. By measuring the resulting current, the electrical resistance inside any particular cell can be determined. The electrical resistance is indicative for the orientation (or polarity) of the second writable plate. It is noted that if the two plates have the same polarity (or magnetization direction) the resistance is relatively lower, and this can be considered as a bit with value "1", while if the two plates are of opposite polarity the resistance will be relatively higher and this may be considered as a bit with value "0". It is noted the values "1" and "0" are arbitrary.

Data may be written to cells using a variety of means. In a simple example each cell is located in between a pair of electrically conductive "write" lines arranged at right angles to each other, i.e. one line located above (e.g. "parallel to an x-axis") and one line located below the cell (e.g. "parallel to an y-axis"). When current is passed through the write lines, as a result an induced magnetic field is created at the junction of the lines. The induced magnet field exerts its force on the writable second plate. In this example a fairly substantial current to generate the field is required, which makes it less interesting for low-power uses, being one of MRAM's primary disadvantages. Additionally, as the cells are scaled down in size, following Moore's law, the induced magnetic field starts overlapping adjacent cells more and more. As a result cells become less reliable and potential false writes may occur. In other words, cells can not be too small in this respect.

A newer technique, spin transfer torque (STT) or spin transfer switching, uses spin-aligned ("polarized") electrons to directly exert a torque on the cell magnetic orientation. Specifically, if the electrons flowing into a layer have to change their spin, this will develop a torque that will be transferred to the nearby layer. This lowers an amount of current (possibly up to 50 times) needed to write the cells, making it about the same as in the read process. For this reason, the STT might be used for cells of 65 nm and smaller. A disadvantage of this technique is a requirement to maintain spin coherence (alignment of spins). Overall, the STT requires much less write current than conventional or toggle MRAM. The technique is limited to lower write speed, because at a higher speed still a higher current is required.

Another technique for writing cells is called "Thermal Assisted Switching" (TAS-MRAM). Therein the magnetic tunnel junctions during the write process (i.e., when applying an electromagnetic field or writing current) are briefly heated by an electrical current whereas the junctions are kept stable (at a colder temperature). Herein the switching velocity is limited by the heating current pulse duration (more than several hundreds of picosecond (typically 500 psec-1 nsec).

Materials and challenges associated with MRAM represent a potential conflict in five different requirements, such as write current, stability of the cells, readability, read/write speed and process integration with CMOS. Selection of materials and design of MRAM to fulfil those requirements are therefore considered critical for its performance. Attention is drawn specifically to drawbacks relating to relatively large power consumption, write-selectivity and thermal stability.

The following relates to a few historical examples. Toshiba and NEC announced (in 2006) a 16 Mbit MRAM chip with a new "power-forking" design. It achieved a transfer rate of 200 MB/s, with a 34 ns cycle time and a physical size of 78.5 square millimetres, at a voltage requirement of 1.8 volts. In 2011 the Physikalisch-Technische Bundesanstalt (PTB), Germany, has achieved a below 500 ps (2 GBit/s) write cycle. Note that these speeds are relatively low compared to CPU speeds, making access to memory a limiting factor in data processing.

A few documents recite laser induced changes in materials.

In "Ultrafast demagnetization enhancement in CoFeB/MgO/CoFeB magnetic tunneling junction driven by spin tunneling current", by Wei He, et al., in Scientific Reports, vol. 3, 7 Oct. 2013, the above stack of layers is studied. Using a laser (de)magnetization behaviour of a layer is studied. The layer is not a tunnel magnetoresistance (TMR) device, as it contains no electrodes or the like. Such is in line with earlier studies by the present inventors, but does not relate to an MRAM or the like.

Guo-Xing Miao et al. in "Tunneling path toward spintronics", Rep. Prog. Phys. 74, vol. 3, 2011, recites use of short laser pulses to induce phase- and structural-changes in materials. Such changes are not rewritable, because the induced laser changes cannot be reset; Mykola M. Krupa at al. in "Changes in the Structure and Magnetic Characteristic of Nanofilms and Control of Spin Current by Short Laser Pulses", American Journal of Nanomaterials. 2013, Vol. 1 No. 2, 13-23, recites laser induced changes (doping) in materials but has nothing to do with a magnetic-optical device; and the document WO 2013/131510 A1 recites basic principles of tunnelling devices, but no ultra-fast laser pulses seem to be used.

The above problems and disadvantages indicate a need for improvement of electronic devices and especially components thereof.

The present invention therefore relates to a magneto-optical device, which overcomes one or more of the above disadvantages, such as minimizing energy consumption, using readily available material, at low (energy) costs, without jeopardizing functionality and advantages.

BRIEF SUMMARY OF THE INVENTION

The present invention relates in a first aspect to an integrated magnetic-optical device according to claim 1, having both a magnetic unit and an optical unit. The present device has an optically switchable (M)RAM.

In the present device the use of ultrafast laser illumination during the heating step gives rise to a new generation of e.g. Thermally-Assisted MRAM, which provides write-selectivity, ultra-low power consumption, thermal-stability, and extremely high operational speeds, exceeding by several orders of magnitude the prior art.

The present invention relates to a magnetic unit, such as a MRAM, having at least two magnetic layers, and an intermediate tunnelling layer therein between. The second magnetic layer is accessible to the present optical unit in that a laser or heat pulse provided by the optical unit may switch a magnetic orientation of the second layer. The optical unit may comprise further elements, such as for directing the laser pulse towards the second magnetic layer, e.g. of an individual cell thereof.

The first magnetic layer preferably has a thickness of 1-50 nm, more preferably 2-25 nm, such as 3-10 nm.

The second magnetic layer preferably has a thickness of 1-100 nm, more preferably 2-50 nm, such as 3-25 nm.

The tunnelling layer is preferably as thin as possible, but not too thin. Thicknesses of 1 nm-20 nm are preferred, such as 2 nm-5 nm.

Use is made of a very fast laser pulse, such as a femtosecond laser pulse. The present laser pulse may be somewhat slower, up to a few picoseconds. The pulse may be compressed to extremely small dimensions, such as of the order of an individual MRAM cell. At present, it induces a quenching of the magnetization within 200 to 500 fs, three orders of magnitude (at least) faster than using (electrical) current pulses. Thereby, with e.g. a single laser diode, inventors can easily illuminate a whole device (comprising thousands of single MRAM units) and selectively chose which one to switch by sending the proper currents to the devices. This feature is also enhancing to some extent the parallel operational workability of the device. Likewise an array or layer of diode(s) may be provided.

The present invention integrates and combines ultrafast laser pulses and MRAM technology, formerly being two separate worlds, making a faster control and manipulation of the magnetization possible. With the use of a single laser pulse the magnetization in a Tunnel Magnetic Resistance (building unit of a MRAM) is quenched within 250 fs and this quenching may also electrically controlled with an applied bias (current or voltage).

Inventors have performed a so-called pump-probe experiment on a real device. Therein also an external voltage/current can be applied. Inventors have found that in addition to anti-parallel and parallel dynamics being different, they are also capable of controlling these by e.g. applying a (static) voltage. The present inventors showed functioning of a built-in device that, exploiting demagnetization given by the laser pulse, makes the magnetization reversal of the layer easier and faster.

In view of integration a femtosecond laser is preferably incorporated into the present device. As femtosecond laser diodes provide reasonably high peak power, reduced dimensions (of the order of a $cm^2$) and are made of semi-conductor based materials, integration with current technology, in e.g. a CMOS process is achievable.

The present invention provides besides MRAMs, hybrid IC(CMOS)/magnetic technology that relates to a totally new approach in the way electronic devices are designed. The present unique set of characteristics combined within magnetic tunnel junctions, such as cyclability, switching speed, and scalability, provides novel electronic systems in which logic and memory are intimately combined in non-volatile logic components (concept of non-volatile CPU). The spin-transfer phenomenon can also be used in the present device to generate large amplitude steady magnetic excitations in magnetic nanostructures. Also new frequency tuneable radiofrequency oscillators are provided. The latter are very attractive for wireless applications which require scanning large frequency bandwidths.

Thereby the present invention provides a solution to one or more of the problems mentioned.

Advantages of the present description are detailed throughout the description.

DETAILED DESCRIPTION OF THE INVENTION

The present invention relates in a first aspect to an integrated magneto-optical device.

In an example the present magneto-optical device further comprises a substrate layer, the substrate being on an opposite side of the device with respect to the second magnetic layer. The substrate may e.g. be a substrate typically used in semiconductor technology, e.g. silicon, silicon-oxide, and combinations thereof. An important advantage is that the present device may be integrated without much trouble in existing technologies, e.g. semiconductor technology, such as CMOS technology. In other words, the present device can be put into practice.

In an example of the present magneto-optical device between the substrate and first magnetic layer one or more intermediate layers are present, preferably one intermediate layer that has no net magnetization, such as an anti-ferro-magnet, and which one or more layers are coupled to the first magnetic layer. The coupling ensures a more reliable storage of data and a stable magnetic orientation of the first magnetic layer.

Further intermediate layers may be present in order to overcome mismatches in crystal lattices between layers. Therewith improved layers in terms of defect density, and electromagnetic properties are provided. Especially an improved selectivity in writing and reading and improved storage stability is provided.

In an example of the present magneto-optical device two or more contacts are provided, a first contact being in electrical connection with the first magnetic layer, and a second contact being in electrical connection with the second magnetic layer. It is noted that the contact lay-out of the present device is simplified compared to standard IC-technology. The contacts are used to provide a field across the tunnel junction layer.

In an example of the present magneto-optical device the second magnetic layer is covered by one or more optically transparent protecting layers, such as one or more of SiO2, indium tin oxide (ITO) and MgO. The protecting layers preferably have a (total) thickness of 0.5-20 nm, more preferably 1-10 nm, such as 2-5 nm.

When a laser is provided this may be provided as an n- and p-doped layer, i.e. a diode laser or direct bandgap semiconductor. Such a laser has a relatively high efficiency, of 40% or more, a high pulse frequency, and has a relatively high output (in terms of mW-kW), and is therefore particularly suited for the present device. Also a series of laser diodes may be used, thereby increasing e.g. an output thereof. Some care has to be taken to prevent electro static damage of a laser; it is noted that such prevention should already be part of an IC-process, and as a consequence is not regarded very critical. Light provided by a laser may also be guided by optical means, such as a glass fibre, an optical antenna, or similar means, such as (for a used wavelength) optical transparent paths. The bandgap of the diode may be further tuned, e.g. to provide a (semi)continuous laser in terms of wavelength. Therewith picosecond and femtosecond pules laser diodes are provided, suited for the present invention. In an example the diode provides relatively high power pulses with a time duration in the range of 1-20 psec. The laser diode is provided with an electrical current, typically in the (100) mA range. A (total) thickness of the diode is in the order of 200 nm-5000 nm. For example, a heterostructure p-$Al_{0.3}Ga_{0.7}As$/GaAs/n-$Al_{0.3}Ga_{0.7}As$ laser may have a thickness of 1000-2000 nm/100-200 nm/1000-2000 nm, respectively. Examples of suitable lasers types are double heterostructure lasers, quantum well lasers, quantum cascade lasers, distributed feedback lasers, vertical cavity surface emitting lasers, vertical external cavity surface emitting lasers and external cavity diode lasers, to name a few. Examples of materials used are III-V semiconductor materials, such as Gallium arsenide, indium phosphide, gallium antimonide, gallium nitride, rare-earth doped Si and Ge, SiGe, strained quantum wells of SiGe [100], nano-porous Si, nano-porous Ge, isoelectronic-impurity-doped SiGe, man-made nano-scale Si columns and dots, nanocrystalline Si and Ge films, quasi-direct-gap short-period Si—Ge atomic-layer superlattices, Si quantum-wire structures, and combinations thereof, all preferably formed by a lithography process or other means. Some structure may have further doped layers. By careful design an optical waveguide may be provided. Photons emitted into a mode of the waveguide will then travel along the waveguide and be reflected several times from each end face before they are emitted towards the present MRAM top layer. As mentioned, one diode may be provided per MRAM cell, a diode layer may be provided on an m×n array of MRAMs, and a diode layer may be provided on several arrays, wherein the arrays may vary in number of cells. The diode layer or diode is preferably provided directly on the one or more optically transparent protecting layers. The protecting layer is preferably also (semi)conducting, and can therefore be used as an electrical path.

In an example of the present magneto-optical device the first and second magnetic layer, each individually, comprise one or more magnetic materials of Group 3-12, Period 4-6 elements, such as Fe, Co, Ni, Gd, and combinations thereof. The magnetic material may be of a natural source, may be synthetic, and may relate to combinations thereof. Recently developed magnetic materials, such as FePd, FeCo and FePt, are preferred in view of their relatively hard magnetic properties. It is also preferred in view of switching behavior to use magnetic material for the second magnetic layer having a relatively low Curie temperature, preferably below 1400 K, more preferably below 1000 K, such as below 700 K, and preferably above operating temperature, such as above 300 K, in view of stability. Suitable materials in this respect are e.g. Ni, MnAs, MnBi, MnSb, $MnOFe_2O_3$, $FeOFe_2O_3$, $NiOFe_2O_3$, $CuOFe_2O_3$, $MgOFe_2O_3$, $Y_3Fe_5O_{12}$, $CrO_2$, $Au_2MnAl$, $Cu_2MnAl$, $Cu_2MnIn$, $Fe_2B$, MnB, FeCoB, alloys hereof, such as Gd alloys, and combinations thereof.

The magnetic material may comprise further elements, selected from B, lanthanoids, scandium, yttrium, and combinations thereof, such as from Sc, Y, Sm, Gd, Dy, Ho, Er, Yb, Tb, such as Tb, and combinations thereof.

In an example of the present magneto-optical device the intermediate tunneling layer comprises an insulator, such as one or more of MgO, $Al_2O_3$, $SiO_2$, and $Si_3N_4$, and/or a conducting layer, such as one or more of Cu, Ag, Au, W, Ti, and Al. Such a layer allows tunneling of electrons and can be integrated in an IC-production process with ease.

In an example of the present magneto-optical device the substrate is Si or $SiO_2$. If Si or $SiO_2$ is used preferably (100) or (110) oriented lattices are used. The present device may be processed on a standard silicon wafer. The wafer may comprise a $SiO_2$ layer with a thickness of 5-5000 nm, more preferably 10-2500 nm, such as 100-1000 nm.

In an example of the present magneto-optical device the one or more intermediate layers are each individually selected from Ru, Ta, IrMn, and combinations thereof. The intermediate layers preferably have a (total) thickness of 2-250 nm, more preferably 5-100 nm, such as 10-50 nm. A preferred layer stack is comprised of Ta, Ru, Ta and IrMn.

In an example of the present magneto-optical device the contact comprises one or more of Au, Ag, Cu, Al, Ti, and W. It is preferred to use IC/CMOS-compatible electrically conducting materials, such as Al and Cu. In a further or combined example the contact may each independently comprise or consist of an optically transparent and conducting material, such as a transparent conducting oxide, such as indium tin oxide (ITO), fluorine doped tin oxide (FTC), and doped zinc oxide, such as aluminum doped zinc oxide, an organic film, such as having a carbon nanotube network and graphene, which organic film can be adapted to be highly transparent to laser light used, and a polymer, such as poly(3,4-ethylenedioxythiophene)(PEDOT) and its derivatives, and combinations thereof. An advantage of a transparent electrode is that the electrode and transparent protecting layer can be combined or be one and the same; hence in a further example at least one electrode and the protecting layer are the same. Also the transparent layer can have a layout such that it comprises two (or more) electrodes.

In an example of the present magneto-optical device the shape of the device is one or more of a rectangular shape, such as a square, a hexagonal shape, a triangular shape, an octagonal shape, a rounded shape, such as a circular shape, and combinations thereof. It is noted that a relatively large degree of freedom is present in this respect. In view of design and occupation of space per cell, rectangular, triangular and hexagonal shapes are preferred.

In an example of the present magneto-optical device the optical unit provides a pulse of less than 1 nsec, such as 50 fsec-500 psec, preferably 250 fsec-250 psec, more preferably 500 fsec-100 psec, even more preferably less than 10 psec. Such a pulse is considered very short. In the present device a pulse of about 1 nsec is considered relatively long; such a pulse introduces more heat than strictly required to change a magnetization. At present the length of a heat pulse it limited by availability of diode lasers; the length of the heat pulse is considered too long, i.e. longer than required. Also an intensity of the heat pulse is of relevance. The short pulse makes very fast switching times possible, in the order of $10^{12}$ Byte/sec. If parallel switching is performed a much faster switching time (per MRAM cell) is achieved, e.g. $10^{15}$ Byte/sec.

In an example of the present magneto-optical device the optical unit provides radiation with a wavelength of 190 nm-2500 nm, preferably 300-1500 nm, more preferably 500-1000 nm. The wavelength is preferably not too short, e.g. in view of damage of the present device. The wavelength may be tunable with respect to the optical properties of the device.

In a second aspect the present invention relates to use of the present device in a non-volatile memory, such as an MRAM, in a CPU, as a binary unit, as a calculating unit, as a static memory, e.g. for starting up and closing down a computer, in a hard disk, in spin-electronics, and combinations thereof. Advantages hereof are described throughout the application.

In a third aspect the present invention relates to a method of changing a magnetization in a device according to the invention comprising the steps of applying an electrical voltage or electrical current to the second magnetic layer and providing an ultrafast optical pulse to the second magnetic layer, thereby orienting/changing the magnetization thereof. Changing a magnetization in a magnetic device using a very short pulse is novel by itself and provides many advantages, as detailed throughout the application.

In a fourth aspect the present invention relates to a method of energy saving comprising the steps of determining a need for an number of devices according to the invention, based on the number determined, switching a part of the devices from an active to an idle status, or from an idle to an active status. As such only a minimal number of devices is required. Such is different from prior art devices, wherein, e.g. due to volatility, all or most of the active components, such as transistors and memory cells, especially RAM and ROM, need to be active, thereby consuming energy. Even further by "saving" the latest settings of the computer, e.g. in terms of active programs, screen information, memory in use, a startup of an electronic device, such as a computer, a smart phone, etc. may occur instantly, i.e. within seconds. Compared to standard start up sequences such is at least a factor faster, thereby saving energy and providing customer satisfaction.

In a fifth aspect the present invention relates to an electronic device comprising a device according to the invention, such as a non-volatile memory, such as an MRAM, a CPU, a binary unit, a calculating unit, a static memory, e.g. for starting up and closing down a computer, a hard disk, and combinations thereof.

In a sixth aspect the present invention relates to a device according to the invention comprising a write scheme, the write scheme comprising one optical unit per one or more magnetic units. Therein writing may be performed by only applying a (laser induced) heat pulse, i.e. in absence of any other stimulus, such as an (external) electromagnetic field. Preferred magnetic layers in such a case are e.g. synthetic ferrimagnetic structures, such as FePt/Ru/Fe, and GdFeCo and TbFeCo. Likewise other Fe alloys can be used, such as FePd and FeCo.

In a seventh aspect the present invention relates to an integrated circuit comprising a device according to the invention, wherein the device functions as one or more of a non-volatile logic component, and a static memory.

In an eighth aspect the present invention relates to a frequency tuneable radiofrequency oscillator comprising one or more arrays of devices according to the invention. In an array there will be some (natural and production process) variation in characteristics of the devices. As a consequence a (Gaussian) distribution of characteristics is present. An array comprising m×n devices may have m×n states providing a bandwidth of frequencies. Within the bandwidth certain frequencies may be selected and/or blocked exploiting the effects already discussed above, thus resulting in an ultrafast tunable oscillator.

In a further example a combination of similar or different arrays may be provided, such as a first array of 30×20 devices, a second array of 10×100 devices, a third array of $10^4 \times 10^6$ devices, etc.

The one or more of the above examples and embodiments may be combined, falling within the scope of the invention.

EXAMPLES

The invention is further detailed by the accompanying figures, which are exemplary and explanatory of nature and are not limiting the scope of the invention. To the person skilled in the art it may be clear that many variants, being obvious or not, may be conceivable falling within the scope of protection, defined by the present claims.

EXPERIMENTS

Summary: Inventors present results concerning laser-induced ultrafast demagnetization in a biased magnetic tunnel junction (MTJ), showing control of magnetization dynamics with an external bias, exploiting spin filtering properties of MTJs. Research indicates that ultrafast demagnetization in MTJs relates to photo-excited currents promoted across the tunnel barrier. This implies that, in a multilayer system, a contribution up to a few tens of percent to ultrafast demagnetization may be due to transport phenomena. The present results relate to optically addressed spintronic devices which benefit in speed of operation and performances compared to their all-electric analogues.

Experiment 1

The studied MTJ samples are hetero-structures of (from bottom to top, thickness reported in parenthesis in nm): $Ir_{22}Mn_{78}$ (15)/$Co_{40}Fe_{40}B_{20}$ (5)-/MgO (2)/$Co_{40}Fe_{40}B_{20}$ (10). These layers are grown on a buffer stack of $Si/SiO_2$ (1000)/Ta (5)/Ru (18)/Ta (3). The devices are then capped with $MgO(2)/SiO_2$ (2). The schematic representation of the layer stack is presented in FIG. 1a. The thickness in nm of the different layers is reported in parenthesis within each layer.

Transparent materials ($MgO/SiO_2$) were used as a top coating and the gold contacts were designed such as to have optical access to the magnetic layers. Moreover, the topmost $Co_{40}Fe_{40}B_{20}$ magnetic layer has a larger thickness than the buried one. Inventors dimensioned these layers in order to optimize the optical absorption in the top-layer and to minimize the laser power absorbed by the buried CoFeB and IrMn layers.

The static (no optical excitation) magnetic and electric characterization of one of these devices with diameter d=125 µm are presented in FIG. 2. FIG. 2(a) shows (in full diamonds) that the Kerr ellipticity $\epsilon$ signal, proportional to the magnetization, is composed of two contributions: a squared loop around zero field, characterized by a small coercivity associated to the top (free) layer, and a broader and smaller one shifted by exchange bias, corresponding to the buried (pinned) layer. The resistance of the device [red open squares in FIG. 2(a)], measured with an external voltage applied between the two magnetic layers of 20 mV, presents two states with low (high) resistance corresponding to parallel (antiparallel) alignment of the magnetizations of the two CoFeB layers. The corresponding tunneling magneto-resistance (TMR), defined as TMR=$(R\downarrow\uparrow - R\uparrow\uparrow)/R\uparrow\uparrow$, is about 10% at room temperature (RT) for the device reported in FIG. 2(a). More in general, devices with TMR ranging from 8 to 20% (the larger values are generally associated to smaller devices) and a Resistance per Area figure of merit RA=$1.5\times10^5$–$4\times10^5$ Ω$\mu m^2$ were obtained; RA values similar to those obtained in standard MgO based tunneling junctions. FIG. 2(b) presents the TMR value as a function of the bias voltage $V_{bias}$, showing a ~30% TMR reduction by increasing $|V_{bias}|$ from 0 to 400 mV, independent from the sign of $V_{bias}$.

The laser-induced magnetization dynamics was studied by a time-resolved stroboscopic magneto-optical pump-probe technique at room temperature, using an amplified Ti:sapphire system (repetition rate f=250 kHz, output power $P_{av}$=1.5 W, emission wavelength λ=800 nm, pulse duration δ=80 fs). The laser beam was split with a 90%-10% beam splitter to set up a non-collinear pump-probe scheme. The pump beam was doubled in frequency with a nonlinear low-temperature β phase Barium Borate (BBO) crystal. Both beams, after being delayed with respect to each other, were linearly polarized (s-polarization for the pump, p-polarization for the probe) and then superimposed on the sample. Inventors estimate that 72% of the impinging pump fluence is reflected, 18% is absorbed by the free layer, 4% by the pinned one, and another 5% by the IrMn underlayer. The remaining laser power is absorbed in the buffer layers.

The laser-induced changes in magnetization are studied by recording the Kerr ellipticity $\epsilon$ variation experienced by the probe beam as a function of the relative time delay t between pump and probe. By measuring the sample response at different external fields (controlling the magnetic coupling between the layers), inventors are able to evaluate the magnetization-dependent variations in $\epsilon$ for different cases. In a first case with $\Delta\epsilon^{top}$ (t) the pump-induced variation in $\epsilon$ solely in the top layer; this is possible exploiting the exchange bias of the MTJ, and measuring at two external field such to have opposite direction of the top layer magnetization while keeping the bottom one unchanged. In a second case $\Delta\epsilon^{total}$ (t) is the pump-induced variation for the whole device.

FIG. 3(a) shows the ultrafast laser-induced changes in $\Delta\epsilon^{top}$ as a function of the pump-probe delay and for different bias voltages. Inventors limited the study to $|V_{bias}|$<500 mV to avoid breakdown of the MgO barrier. The measurements were performed at three different external magnetic fields: $H_{ext}=-100$, 75 and +300 G, respectively, to set the coupling in the parallel, antiparallel and reversed parallel state. In the case of unbiased measurements, an ultrafast change in ellipticity is triggered with a signal reduction of 11.5% within 380 fs. A remarkable finding is that inventors are able to strongly modulate the $\Delta\epsilon^{top}$ (t) signal by applying a bias [see FIG. 3(a)]: $\Delta\epsilon^{top,max}$, the maximum $\Delta\epsilon^{top}$ change, is only 8.5% for $V_{bias}=\pm 400$ mV, corresponding to a variation of about 30% with respect to the zero bias case.

The inventors assume that the measured changes in ellipticity are directly proportional to the pump-induced demagnetization of the layers. Inventors conclude that part of the demagnetization can be attributed to spin-polarized currents, promoted by the optical pulse. In the present experiment, the electrons are excited with relatively high energy photons ($\hbar\upsilon=3$ eV), creating a significant temperature difference between the layers and a decrease in the magnetization. The inventors believe this leads to two effects: (i) demagnetization of thermal/scattering origin and (ii) thermally- and optically-assisted transport of spin polarized carriers across the MTJ barrier. The Inset of FIG. 3(a) shows a pictorial view of the optically excited spin-polarized electron contributions to the ultrafast demagnetization, which will be further elaborated in the following.

By optically pumping a ferromagnetic material (Fe) a spin polarized current may be generated which can diffuse into an adjacent gold layer. Similarly, a spin-polarized electron population is excited in the free CoFeB layer, which has been found to tunnel through the MgO barrier and cross the MTJ device. In the case of FIG. 3(a), by exploiting the spin filtering effect of the MTJ (associated with the difference between the two states of conductivity $\sigma\uparrow\uparrow$ and $\sigma\downarrow\uparrow$), inventors achieve an intrinsic spin sensitivity for the contribution of spin-polarized currents to the demagnetization. This results in an increased degree of polarization of the photo-induced current. Minority spins cannot overcome the barrier leading to an enhancement of the measured demagnetization effect. On the other hand, by applying a voltage to the MTJ, inventors reduce the TMR value; it is now easier for both types of electrons to cross the tunneling barrier, therefore a weaker net depletion of majority spins in the irradiated area occurs, i.e. a smaller demagnetization. The voltage dependent reduction of 27% in $\Delta\epsilon^{top}$ corresponds indeed remarkably well with the change in TMR of about 30% shown if FIG. 3(b).

By repeating the experiments reported in FIGS. 3a and 3b at higher fluencies, up to 40% demagnetizations were obtained, but the bias-induced modulation reduced to less than 10% (not shown in the figure).

The measurements were repeated also for different device sizes, finding similar trends with larger MTJs generally presenting lower TMR values and therefore smaller voltage-dependent demagnetizations. Smaller devices offered higher TMR values, but the optical measurements were affected by a lower signal to noise due to the large amount of scattered light by the ring Au contacts.

The observed spin-dependent transport effects naturally lead to the possibility to optically generate spin-polarized currents.

In conclusion, it has been demonstrated that transport phenomena may be responsible for a sizable amount of tens of percent of ultrafast femtosecond laser-induced demagnetization in MTJ devices. The inventors can modulate the laser-induced ultrafast demagnetization in a MTJ up to 30% with a bias voltage applied to the structure.

As a result now control of the magnetization in MTJ-based devices is possible. Illuminating large MTJ arrays with a single laser pulse and electrically address only selected devices is possible. A faster version of heat-assisted solid-state memories is obtained where the size of the memory cells is not limited by diffraction, with the possibility of operating massively parallel memory switching.

BRIEF DESCRIPTION OF THE FIGURES

The invention although described in detailed explanatory context may be best understood in conjunction with the accompanying figures.

FIGS. 1a and 1b: Left (1a): Schematic representation of the layers stack composing the MTJ samples and Right (1b) 3D schematic of the final structure. Therein, from bottom to top (thickness in parenthesis): Si subtrate 1, $SiO_2$ (1000) 2, Ta (5) 3, Ru (18) 4, Ta (3) 5, IrMn (15) 6, $Fe_{40}Co_{40}B_{20}$ (5) 7, MgO (2) 8, $Fe_{40}Co_{40}B_{20}$ (10) 9, MgO (2) 10, and $SiO_2$ (2) 11. To the left and right Au contacts 21 and 22 are provided, respectively.

FIGS. 2a and 2b: 2(a) Static Kerr ellipticity $\epsilon$ (closed diamonds; left vertical axis in degrees) for the exchange-biased tunneling junction and the change in electrical resistance R (open squares; right vertical axis in $\Omega$) as a function of the external magnetic field G (horizontal axis). The arrows indicate the relative magnetic coupling of the CoFeB layers as a function of the external magnetic fields. 2(b) Change of the TMR value (left vertical axis in %) as a function of the external (bias) voltage (horizontal axis in mV) applied to the structure. The curves in (a) and (b) are measured on a device with diameter d=125 µm.

DETAILED DESCRIPTION OF THE FIGURES

Figures 3A, 3B:
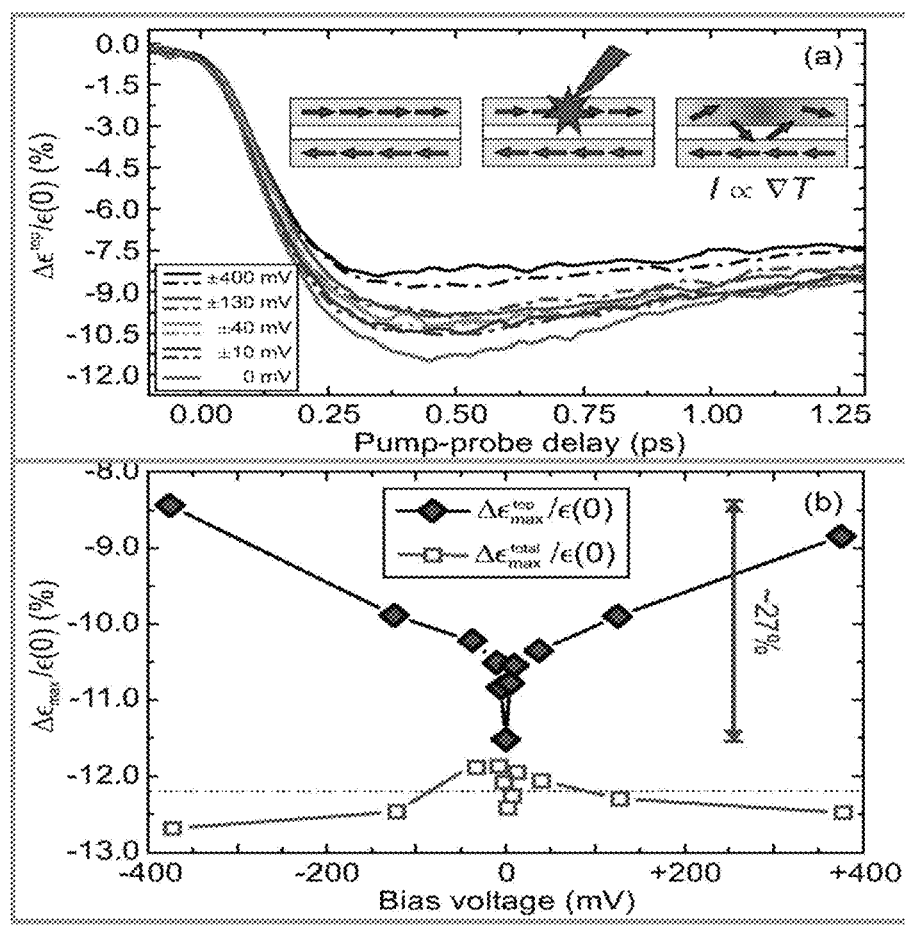
FIGS. 3a and 3b: 3(a) Ultrafast variations ($\Delta\epsilon^{loop}/\epsilon(0)$ in %; left vertical axis) in the probe beam ellipticity, measured with longitudinal MOKE as a function of the pump-probe delay (ps, horizontal axis) and the bias voltage. The curves address the changes in the top layer (from top to bottom: ±400 mV, ±130 mV, ±40 mV, ±10 mV, 0 mV). The fluence impinging on the sample is 4.5 mJ/cm². Inset: Pictorial view of the contributing effects in the laser-induced ultrafast demagnetization. 3(b) Maximum change in ellipticity ($\Delta\epsilon_{max}/\epsilon(0)$ in %; left vertical axis)as a function of the bias voltage (mV, horizontal axis) for both cases. The curves in (a) and (b) are measured on a device with diameter d=125 µm.

Details of the figures are given above in the section relating to the experiments.

What is claimed is:
1. An integrated magneto-optical device comprising a magnetic unit and an optical unit,
    (i) the magnetic unit comprising
        (a) a first magnetic layer for maintaining a baseline magnetic orientation,
        (b) a second magnetic layer, accessible to optical radiation,
        (c) an intermediate tunneling layer between the first and second magnetic layers,
            wherein the first magnetic layer, the second magnetic layer, and the intermediate tunneling layer form a magnetic tunnel junction, and
        (d) a substrate layer, the substrate being on an opposite side of the device with respect to the second magnetic layer, wherein between the substrate and first magnetic layer one or more intermediate layers are present being magnetically coupled to the first magnetic layer, wherein two or more contacts are provided, a first contact being in electrical connection with the first magnetic layer, and a second contact being in electrical connection with the second magnetic layer, for applying an electrical voltage or electrical current across the magnetic tunnel junction layers during provision of an ultrafast optical pulse to said second magnetic layer, and wherein said contacts are arranged to provide optical access to said second magnetic layer, and (ii) the optical unit comprising one or more lasers, wherein the optical unit is provides sub nanosecond optical pulse radiation to the second magnetic layer for switching a magnetic orientation thereof.

2. The device according to claim 1, wherein the second magnetic layer is covered by one or more optically transparent protecting layers, and wherein the one or more optically transparent protecting layer is selected from one or more of $SiO_2$, InTiO and MgO.

3. The device according to claim 2, wherein at least one contact and the optically transparent protecting layer are one and the same.

4. The device according to any of the preceding claims, wherein the intermediate tunneling layer comprises an insulator, and/or a conducting layer.

5. The device according to claim 1, wherein the substrate is Si or $SiO_2$, and/or the one or more intermediate layers are each individually selected from Ru, Ta, IrMn, and combinations thereof.

6. The device according to claim 1, wherein the first and second magnetic layer, each individually, comprise one or more magnetic materials selected from Group 3-12, Period 4-6 elements, and combinations thereof, and wherein the electrical contacts comprises one or more of Au, Ag, Cu, Al, Ti, and W.

7. The device according to claim 1, wherein the shape of the device is one or more of a rectangular shape, a hexagonal shape, a triangular shape, an octagonal shape, a rounded shape, and combinations thereof.

8. The device according to claim 1, wherein the optical unit provides radiation with a wavelength of 190 nm-2500 nm.

9. Use of a device according to claim 1 in a non-volatile memory, in a CPU, as a binary unit, as a calculating unit, as a static memory, in a hard disk, in spin-electronics, and combinations thereof.

10. A method of changing a magnetization in a device according to claim 1, comprising the steps of applying an electrical field across the magnetic tunnel junction layers and providing an ultrafast optical pulse to the second magnetic layer, thereby orienting/changing the magnetization thereof.

11. An electronic device comprising a device according to claim 1, selected from at least one of a non-volatile memory, an MRAM, a CPU, a binary unit, a calculating unit, a static memory, and a hard disk.

12. The device according to claim 1, comprising a write scheme, the write scheme comprising one optical unit per one or more magnetic units.

13. Use of an integrated circuit comprising a device according to claim 1, in one or more of a non-volatile logic component and a static memory.

14. A frequency tuneable radiofrequency oscillator comprising one or more arrays of devices according to claim 1.

* * * * *